United States Patent
Shibata et al.

(10) Patent No.: US 7,760,573 B2
(45) Date of Patent: Jul. 20, 2010

(54) SEMICONDUCTOR MEMORY DEVICE AND STRESS TESTING METHOD THEREOF

(75) Inventors: Kayoko Shibata, Tokyo (JP); Hiroaki Ikeda, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 270 days.

(21) Appl. No.: 11/349,091

(22) Filed: Feb. 8, 2006

(65) Prior Publication Data

US 2006/0195734 A1    Aug. 31, 2006

(30) Foreign Application Priority Data

Feb. 10, 2005    (JP)    ............... 2005-034009

(51) Int. Cl.
G11C 5/14    (2006.01)
(52) U.S. Cl. ................. 365/226; 365/189.09
(58) Field of Classification Search ................ 365/233, 365/226, 222, 63, 189.09; 257/686
See application file for complete search history.

(56) References Cited

U.S. PATENT DOCUMENTS

| | | | |
|---|---|---|---|
| 6,198,136 B1 * | 3/2001 | Voldman et al. ............ | 257/357 |
| 6,216,185 B1 * | 4/2001 | Chu ............................ | 710/303 |
| 6,333,895 B1 * | 12/2001 | Hamamoto et al. ........ | 365/233 |
| 6,958,947 B2 * | 10/2005 | Park et al. ................... | 365/228 |
| 2002/0105845 A1 * | 8/2002 | Hidaka ........................ | 365/222 |
| 2004/0015807 A1 * | 1/2004 | Honjou et al. ............... | 716/16 |
| 2005/0139978 A1 * | 6/2005 | Hirose ........................ | 257/686 |
| 2005/0162182 A1 * | 7/2005 | Ong ............................ | 324/765 |
| 2005/0212110 A1 * | 9/2005 | Kato ............................ | 257/686 |

FOREIGN PATENT DOCUMENTS

| JP | 58-114392 A | 7/1983 |
|---|---|---|
| JP | 03-041758 | 2/1991 |
| JP | 05-243482 | 9/1993 |
| JP | 6-55324 A | 3/1994 |
| JP | 6-203600 A | 7/1994 |
| JP | 06-291250 | 10/1994 |
| JP | 8-167703 | 6/1996 |
| JP | 2003-208800 A | 7/2003 |

(Continued)

OTHER PUBLICATIONS

Japanese Office Action, with partial English translation, issued in Japanese Patent Application No. JP 2005-034009, mailed Dec. 4, 2007.

*Primary Examiner*—Vu A Le
*Assistant Examiner*—Han Yang
(74) *Attorney, Agent, or Firm*—McDermott Will & Emery LLP

(57) ABSTRACT

A semiconductor memory device includes a core chip having at least memory cells formed in the core chip, an interface chip having at least peripheral circuits of the memory cells formed in the interface chip, and an external terminal group. The external terminal group includes at least a core power supply terminal that is connected to an internal circuit of the core chip without being connected to an internal circuit of the interface chip, and an interface power supply terminal that is connected to an internal circuit of the interface chip without being connected to the internal circuit of the core chip. With this arrangement, mutually different operation voltages that are optimum for both chips can be given to these chips.

22 Claims, 8 Drawing Sheets

FOREIGN PATENT DOCUMENTS

| | | |
|---|---|---|
| JP | 2003-218210 A | 7/2003 |
| JP | 2004-152399 A | 5/2004 |
| JP | 2004-152810 | 5/2004 |
| JP | 2004-327474 A | 11/2004 |
| JP | 2005-244143 | 9/2005 |
| JP | 2006-012358 | 1/2006 |

* cited by examiner

SEMICONDUCTOR MEMORY DEVICE AND STRESS TESTING METHOD THEREOF

TECHNICAL FIELD

The present invention relates to a semiconductor memory device and a method of a stress test of the semiconductor memory device. Particularly, the present invention relates to a semiconductor memory device having a core section and an interface section structured by separate chips respectively, the core section being formed with memory cells, and the interface section being formed with a peripheral circuit of the memory cells. The invention also relates to a method of a stress test of such semiconductor memory device.

BACKGROUND OF THE INVENTION

The storage density of a semiconductor memory device as represented by a DRAM (Dynamic Random Access Memory) is increasing in recent years, and a high speed is also required. The increase of the storage density has so far been achieved mainly by downsizing of memory cells and increase of chip sizes. However, there is a certain physical limit to a reduction in the size of the memory cell, and the increase in the chip size decreases productivity and hinders a speed increase.

In order to substantially solve the above problems, there is proposed a method of using separate chips for the core section that is formed with memory cells and the interface section that is formed with a peripheral circuit of the memory cells (see Japanese Patent Application Laid-open No. 2004-327474). According to this method, a semiconductor memory device that has conventionally one chip is divided into plural chips. Therefore, the size of one chip can be decreased substantially. Consequently, according to this method, it is expected to be able to achieve a larger density while securing high productivity.

When the core section and the interface section are formed using separate chips, core chips can be manufactured in the memory process, and the interface chips can be manufactured in the logic process. In general, a transistor manufactured in the logic process can achieve higher-speed operation than a transistor manufactured in the memory process. Therefore, when the interface chip is manufactured in the logic process, the circuit of the interface chip section can be operated at a higher speed than that conventionally achieved. Accordingly, the semiconductor memory device can achieve high-speed operations. Furthermore, the operation voltage of the interface chip can be decreased to about 1V, thereby decreasing power consumption.

However, when the core chip is a DRAM, it is difficult to greatly decrease the operation voltage. Therefore, when the power supply terminal of the core chip is made common to the power supply terminal of the interface chip, an optimum voltage cannot be given to each chip. When the power supply terminal is made common, there is a risk of damaging the interface chip in the stress test (burn-in test). In other words, in the burn-in test, a high stress needs to be given to the memory cells, by applying a higher voltage than that usually used. However, when this high voltage is also applied to the interface chip, the transistor within the interface chip having a low withstand voltage has a risk of being broken.

Various methods of applying different voltages to the core section and the interface section within the same chip are conventionally proposed (see Japanese Patent Application Laid-open Nos. 2004-152399, 2003-218210, 2003-208800, H6-203600, H6-55324, and S58-114392).

According to these methods, a power supply pad for supplying an operation voltage to the core section and a power supply pad for supplying an operation voltage to the interface section are provided separately. However, when the core section and the interface section use different chips, the power supply pads for the respective chips are provided separately. Therefore, a connection path for connecting each power supply pad to an external terminal is necessary, unlike the configuration of the usual semiconductor memory device having one chip.

On the other hand, when the core chip and the interface chip are applied with mutually different voltages, the amplitude of the signal within the core chip is different from the amplitude of the signal within the interface chip. Therefore, there is a risk of the occurrence of a trouble in exchanging a signal between these chips. This problem is serious in the burn-in test. When a high-voltage signal is output from the core chip to the interface chip, there has been a risk that transistors in the input circuit of the interface chip are latched up, thereby breaking the interface chip.

SUMMARY OF THE INVENTION

The present invention has been achieved to solve the above problems. It is an object of the invention to provide an improved semiconductor memory device having the core section and the interface section structured by mutually different chips.

It is another object of the invention to provide a semiconductor memory device having the core section and the interface section structured by mutually different chips, the semiconductor device capable of preventing the interface chip from being broken at the time of carrying out a stress test such as a burn-in test.

The above and other objects of the present invention can be accomplished by a semiconductor memory device comprising at least one core chip having at least memory cells; an interface chip having at least peripheral circuits of the memory cells formed in the core chip; and an external terminal group including at least a core power supply terminal that is connected to an internal circuit of the core chip without being connected to an internal circuit of the interface chip, and an interface power supply terminal that is connected to an internal circuit of the interface chip without being connected to the internal circuit of the core chip.

According to this aspect of the present invention, a power supply potential can be supplied to the core chip via the core power supply terminal, and a power supply potential can be supplied to the interface chip via the interface power supply terminal. Therefore, mutually different operation voltages that are optimum for the respective chips can be supplied to both chips. In the present invention, preferably, the core chip and the interface chip are stacked, and plural core chips are available. In this case, at least one of the core chips and the interface chip has a through-hole, and an operation voltage is supplied to the internal circuit of the core chips and the interface chip via a through-electrode provided in the through-hole.

The above and other objects of the present invention can also be accomplished by a method of a stress test of a semiconductor memory device comprising a step of testing the core chip and the interface chip simultaneously by applying mutually different voltages to the core power supply terminal and the interface power supply terminal.

According to this aspect of the present invention, a core power supply terminal and an interface power supply terminal are applied with mutually different voltages during a stress test such as a burn-in test. Therefore, even when the interface chip is manufactured in the logic process, a transistor included in the interface chip is not broken during the stress test.

The above and other objects of the present invention can also be accomplished by a semiconductor memory device, comprising: at least one core chip having at least memory cells; an interface chip having at least an input/output circuit of the memory cells formed in the interface chip; and an external terminal group including at least a core power supply terminal connected to a first internal circuit of the core chip, and a common power supply terminal connected to a second internal circuit of the core chip and a predetermined circuit of the interface chip.

According to this aspect of the present invention, a voltage supplied to the interface chip is given to a part of the internal circuits of the core chips. Therefore, amplitudes of signals exchanged between the core chip and the interface chip can be matched. Consequently, a latch up does not occur within the interface chip. In this aspect of the present invention, it is also preferable that the core chip and the interface chip are stacked, and that plural core chips are available. In this case, at least one of the core chips and the interface chip has a through-hole, and an operation voltage is supplied to the internal circuit of the core chips and the interface chip via a through-electrode provided in the through-hole.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
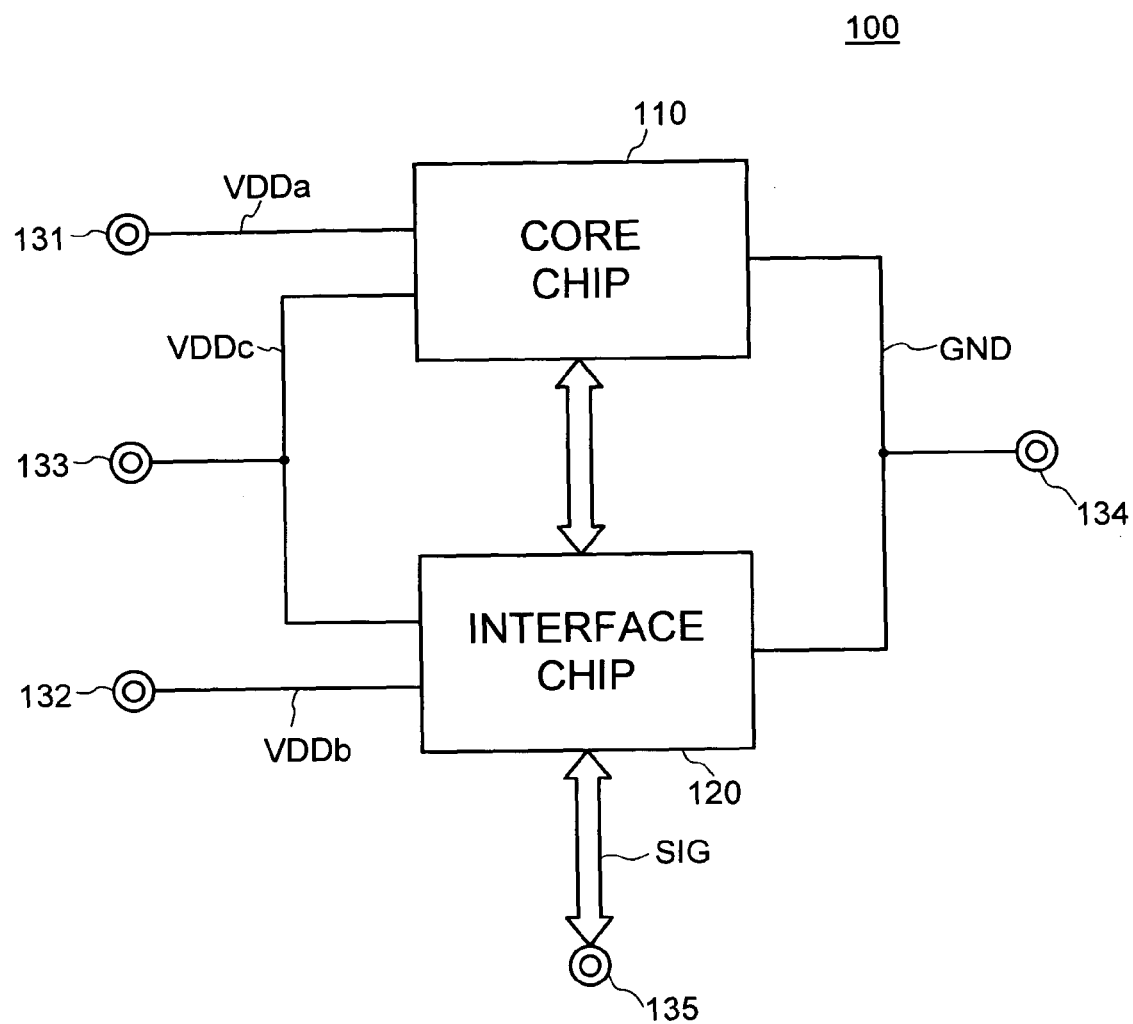
FIG. 1 is a conceptual diagram of a configuration of a semiconductor memory device according to a preferred embodiment of the present invention.

FIG. 1 is a conceptual diagram of a configuration of a semiconductor memory device 100 according to a preferred embodiment of the present invention.

As shown in FIG. 1, the semiconductor memory device 100 according to the present embodiment includes a core chip 110, an interface chip 120, and external terminals 131 to 135 (hereinafter, also collectively referred to as an external terminal group 130).

In the core chip 110, many memory cells such as DRAMs are formed, and also circuits that hold data of the memory cells, that is, a pre-charge circuit, a sense amplifier, an address decoder circuit, a circuit necessary to decide wafer quality in the core chip wafer test, and input and output stages to the interface chip 120 are also formed. On the other hand, in the interface chip 120, there are formed peripheral circuits of the core chip 110 such as an address buffer, a refresh counter, input and output circuits to external circuits, or circuits other than the circuits that are minimum necessary to decide quality in the core chip wafer test.

As explained above, according to the semiconductor memory device 100 of this embodiment, a semiconductor memory device that has usually one chip is divided into plural chips. Circuits that require analog operation like the sense amplifier, in addition to the memory cells, are arranged in the core chip 110. Other logic circuits are arranged in the interface chip 120.

The external terminal group includes a core power supply terminal 131 that supplies a power supply potential VDDa to the core chip 110, an interface power supply terminal 132 that supplies a power supply potential VDDb to the interface chip 120, a common power supply terminal 133 that supplies a power supply potential VDDc to both the core chip 110 and the interface chip 120, a ground terminal 134 that supplies a ground potential GND to both the core chip 110 and the interface chip 120, and a signal terminal 135 that gives and receives an input/output signal SIG via the interface chip 120. The input/output signal SIG includes an address, data, a command, and a clock.

The core power supply terminal 131 is connected to the internal circuit of the core chip 110 without being connected to the internal circuit of the interface chip 120. Therefore, the power supply potential VDDa supplied via the core power supply terminal 131 is not applied to the interface chip 120.

The description of "the core power supply terminal 131 is connected to the internal circuit of the core chip 110 without being connected to the internal circuit of the interface chip 120" includes not only the case where the core power supply terminal 131 is connected to the internal circuit of the core chip 110 without being in contact with the interface chip 120 at all, but also the case where the core power supply terminal 131 is connected to the internal circuit of the core chip 110 via merely a power supply line or a through-electrode provided within the interface chip 120. In other words, the core power supply terminal 131 can have contact with the interface chip 120 so long as no contribution is made to the operation of the internal circuit such as a transistor included in the interface chip 120.

Similarly, the interface power supply terminal 132 is connected to the internal circuit of the interface chip 120 without being connected to the internal circuit of the core chip 110. Therefore, a power supply potential VDDb supplied via the interface power supply terminal 132 is not supplied to the core chip 110.

In this case, the description of "the interface power supply terminal 132 is connected to the internal circuit of the interface chip 120 without being connected to the internal circuit of the core chip 110" includes not only the case where the interface power supply terminal 132 is connected to the internal circuit of the interface chip 120 without being in contact with the core chip 110 at all, but also the case where the interface power supply terminal 132 is connected to the internal circuit of the interface chip 120 via merely a power supply line or a through-electrode provided within the core chip 110. In other words, the interface power supply terminal 132 can have contact with the core chip 110 so long as no contribution is made to the operation of the internal circuit such as a transistor included in the core chip 110.

Based on the above configuration, at least the two kinds of power supply potentials of VDDa and VDDc are given to the core chip 110. Similarly, at least the two kinds of power supply potentials of VDDb and VDDc are given to the interface chip 120. Among the power supply potentials supplied to the core chip 110, the power supply potential VDDa is supplied to at least a circuit part that holds the data of the memory cells, and the power supply potential VDDc is supplied to at least an output stage that outputs a signal to the interface chip 120.

On the other hand, although not particularly limited, one of the power supply potentials VDDb and VDDc supplied to the interface chip 120 is supplied to an address buffer, a decoder, and a refresh counter, and the other power supply potential is supplied to an input/output circuit to an external circuit. In the present invention, it is not essential to divide the power source of the interface chip 120 into plural power sources. However, when the power source for a circuit that can easily become a noise source like the input/output circuit and the power source for other circuit are shared, a malfunction occurs easily. Therefore, it is preferable that at least the power supply route for the input/output circuit is different from the power supply route for other circuits.

It is also preferable that the route of the power supply to the DLL circuit and the reference voltage for the input buffer is different from the route of the power supply to other circuits.

As explained above, according to this embodiment, the core chip 110 and the interface chip 120 can be supplied with mutually different operation voltages. In other words, when the core chip 110 and the interface chip 120 are structured using separate chips, the interface chip 120 can be manufactured in the logic process. In this case, the operation voltage of the interface chip 120 can be set to equal to or lower than 1V. On the other hand, because the core chip 110 needs to be manufactured in the memory process, it is difficult to greatly decrease the operation voltage. Therefore, there is a difference between optimum operation voltages that are applied to these chips.

However, according to this embodiment, the power supply potential VDDa can be supplied to the core chip 110 via the core power supply terminal 131, and the power supply potential VDDb can be supplied to the interface chip 120 via the interface power supply terminal 132. Consequently, the operation voltage optimum for the core chip 110 and the operation voltage optimum for the interface chip 120 can be supplied separately.

Furthermore, according to this embodiment, the power supply potential VDDc that is also supplied to the interface chip 120 is supplied to the output stage that outputs a signal to the interface chip 120 among the internal circuits of the core chip 110. Therefore, the amplitude of the signal to be output from the core chip 110 to the interface chip 120 substantially coincides with the amplitude of the signal within the interface chip 120. Consequently, it becomes possible to match the amplitudes of signals exchanged between these chips, thereby preventing the breakage of the interface chip due to the occurrence of the latch up.

The stress test (burn-in test) of the semiconductor memory device 100 can be carried out as follows.

First, a first test potential is supplied to the semiconductor memory device 100 under the stress test, via the core power supply terminal 131 in the state that the semiconductor memory device 100 is placed in a high-temperature and high-humidity environment. A second test potential is supplied to the semiconductor memory device 100 via the interface power supply terminal 132 and the common power supply terminal 133. When the first test potential is VDD1 and the second test potential is VDD2; these test potentials are set as VDD1>VDD2.

While not particularly limited, the first test potential VDD1 is set to about 2.7V, and the second test potential VDD2 is set to about 2.0V. In this state, the input/output signal SIG that includes an address, data, a command, and a clock is supplied via the signal terminal 135, thereby continuously operating the core chip 110 and the interface chip 120 for a predetermined time.

With this arrangement, because the first test potential VDD1 is applied to the circuit part that holds the data of the memory cells among the internal circuits of the core chip 110, the chips are operated in the state that a high stress is applied to the memory cells. On the other hand, because the second test potential VDD2 that is the same as the potential given to the interface chip 120 is applied to the output stage that outputs a signal to the interface chip 120 among the internal circuits of the core chip 110, a transistor within the interface chip 120 having a low withstand voltage is not broken, even when a signal is output from the core chip 110 to the interface chip 120 during the burn-in test. Accordingly, both the core chip 110 and the interface chip 120 can be tested simultaneously without breaking the interface chip 120.

As explained above, during the burn-in test, the potential (first test potential) that is given to the core power supply terminal 131 is differentiated from the potential (second test potential) that is given to the interface power supply terminal 132 and the common power supply terminal 133. However, during the actual operation, it is not essential to give different potentials to these power supply terminals. In other words, it is also possible to short-circuit two or three of the core power supply terminal 131, the interface power supply terminal 132, and the common power supply terminal 133, based on the conductive patterns within a mother board on which the semiconductor memory device 100 is mounted or within the module.

Several detailed examples of the chip configuration of the semiconductor memory device 100 according to this embodiment are explained below.

Figure 2:
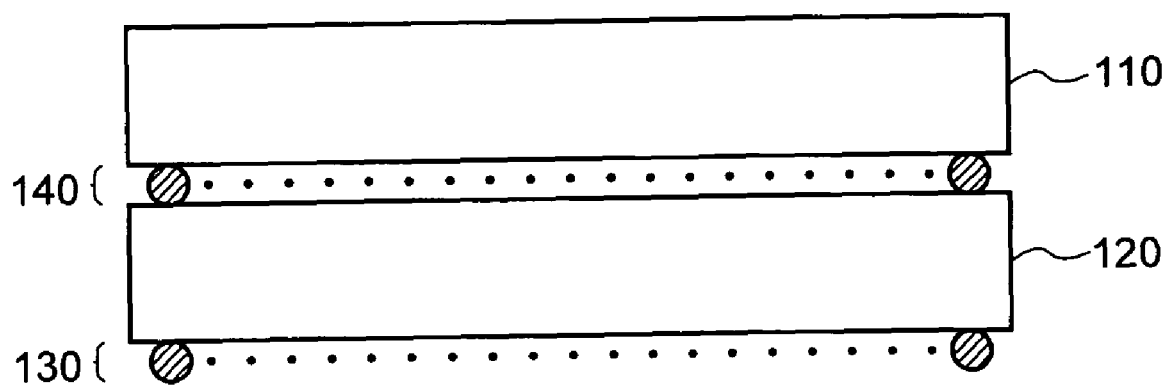
FIG. 2 shows a first configuration example of the semiconductor memory device according to a preferred embodiment of the present invention.

FIG. 2 shows a first configuration example of the semiconductor memory device 100 according to this embodiment.

As shown in FIG. 2, in the first configuration example, the core chip 110 is stacked on the interface chip 120. The external terminal group 130 is formed on the surface of the interface chip 120 at the opposite side of the core chip 110.

Figure 3A:
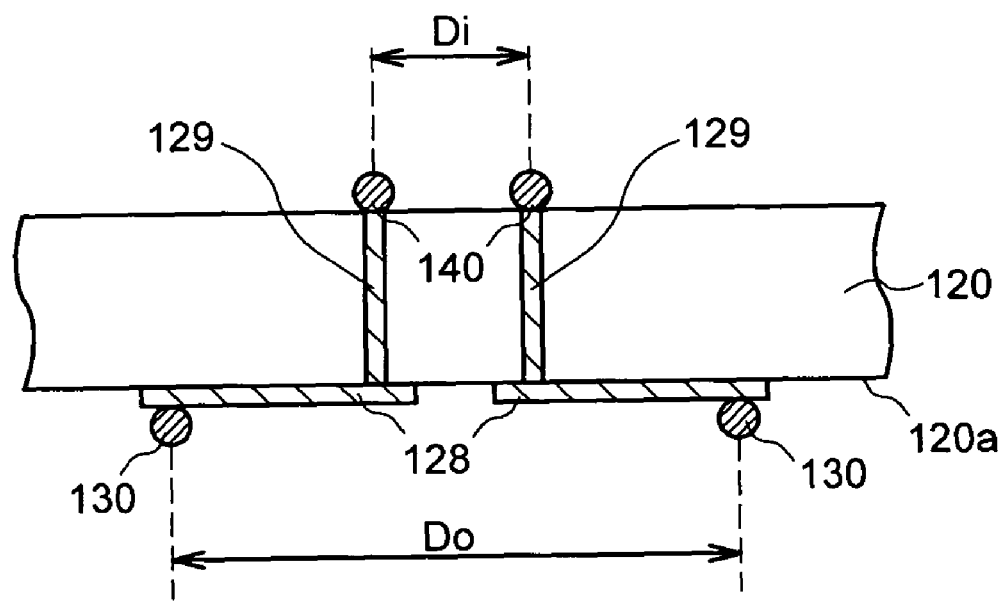
FIG. 3A is an enlarged partial cross-sectional view showing a state that a main surface of an interface chip is the lower side of the interface chip.
Figure 3B:
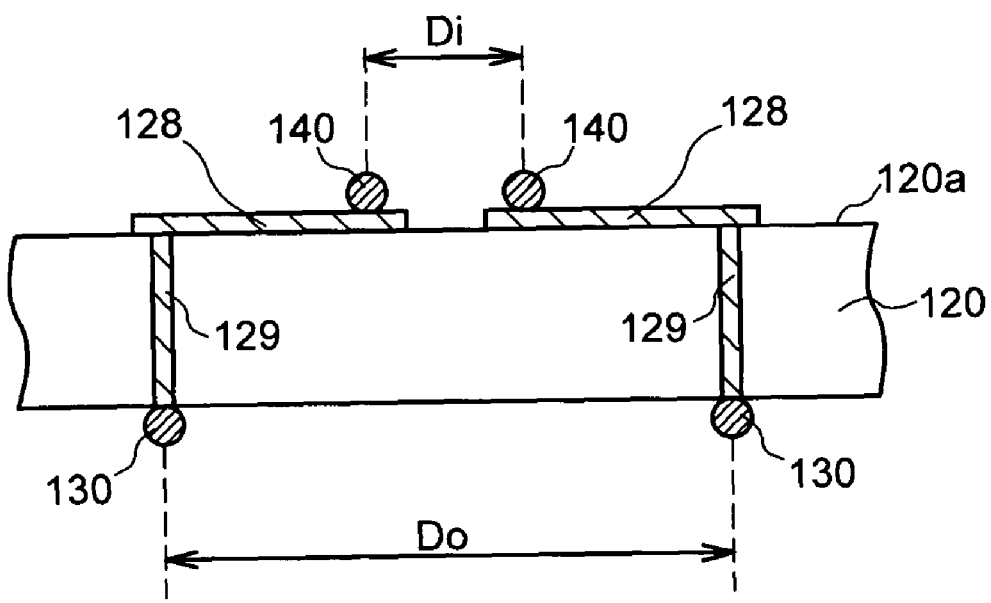
FIG. 3B is an enlarged partial cross-sectional view showing a state that a main surface of the interface chip is the upper side of the interface chip.

A main surface (a surface on which a transistor and the like are formed) of the interface chip 120 can be the lower side (the external terminal group 130 side) or the upper side (the core chip 110 side) of the interface chip 120. FIG. 3A shows a state that a main surface 120a of the interface chip 120 is the lower side of the interface chip 120, and FIG. 3B shows a state that the main surface 120a of the interface chip 120 is the upper side of the interface chip 120.

In this example, a plurality of through-holes needs to be formed on the interface chip 120. The core chip 110 is connected to the interface chip 120, and the interface chip 120 is connected to the external terminal group 130, via through-electrodes 129 provided within the through-hole, as shown in FIGS. 3A and 3B, respectively.

The interface chip 120 plays the original role of a peripheral circuit of the core chip 110. At the same time, the interface chip 120 plays the role of "pitch conversion" to set an electrode pitch Do of the external terminal group 130 larger than an electrode pitch Di of an internal terminal group 140 that connects between the core chip 110 and the interface chip 120. Because the external terminal group 130 is connected to the external circuit such as the mother board, the electrode pitch Do needs to have a certain large size, for example, about 0.8 mm. On the other hand, because the internal terminal group 140 is not connected to the external circuit, the electrode pitch Di can be set a very small size of about 50 μm. This pitch conversion is carried out by the through-hole electrodes 129 provided within the through-hole.

Figure 4A:
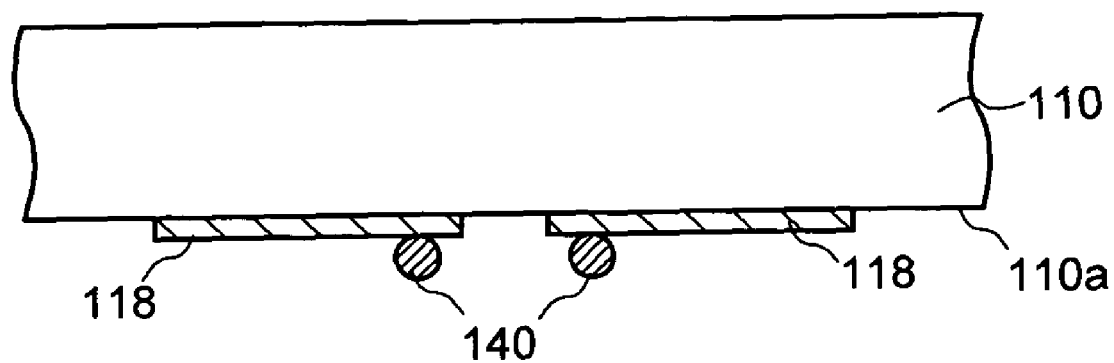
FIG. 4A is an enlarged partial cross-sectional view showing a state that a main surface of the core chip is the lower side of the core chip.
Figure 4B:
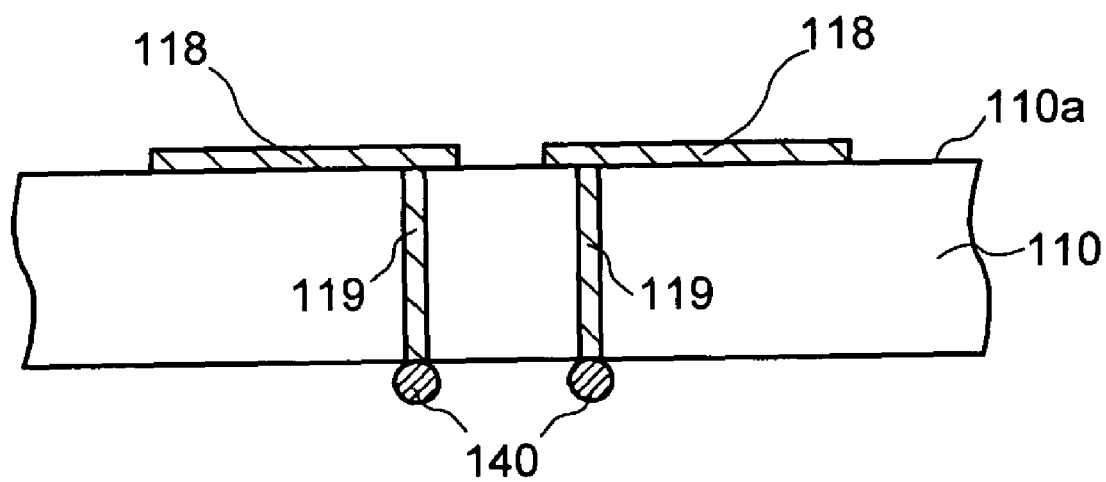
FIG. 4B is an enlarged partial cross-sectional view showing a state that a main surface of the core chip is the upper side of the core chip.

A main surface of the core chip 110 stacked on the interface chip 120 can be also the lower side (the interface chip 120 side) or the upper side (the opposite side of the interface chip 120) of the core chip 110. FIG. 4A shows a state that a main surface 110a of the core chip 110 is the lower side of the core chip 110, and FIG. 4B shows a state that the main surface 110a of the core chip 110 is the upper side of the core chip 110.

In the case where the main surface 110a of the core chip 110 is at the upper side, the internal terminal group 140 needs to be connected to conductive patterns (the internal circuit) 118 via a through electrodes 119 provided within the through-holes. However, when one core chip 110 is used like in this example, it is preferable that the main surface 110a of the core chip 110 is at the lower side. According to this arrangement, a through-hole does not need to be provided in the core chip 110. Therefore, an additional process is not particularly necessary in manufacturing the core chip 110.

Figure 5:
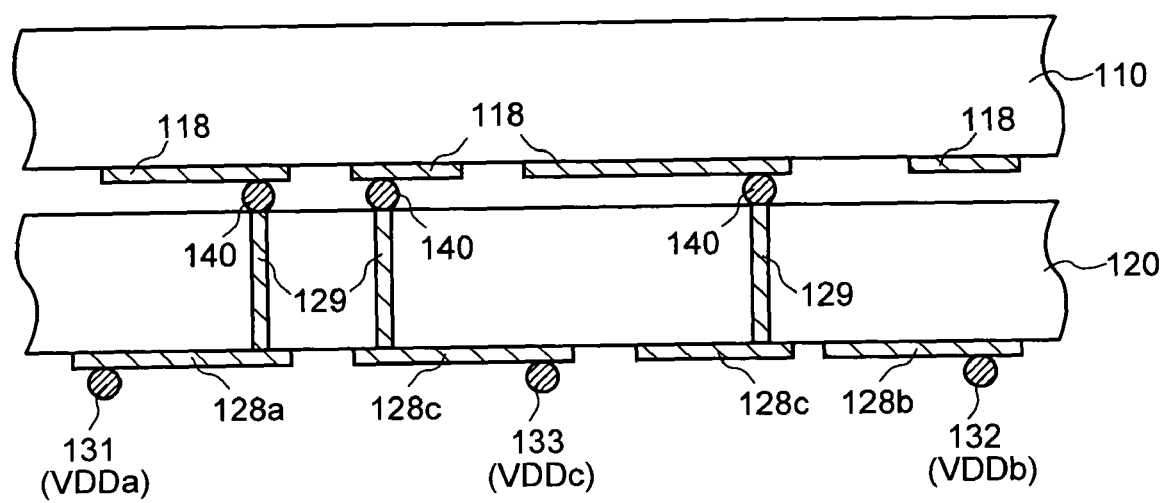
FIG. 5 is an enlarged partial cross-sectional view of the semiconductor memory device according to a first configuration example.

FIG. 5 is an enlarged partial cross-sectional view of the semiconductor memory device 100 according to the first configuration example. FIG. 5 shows a state that the core chip 110 and the interface chip 120 have their main surfaces 110a and 120a set at the lower side respectively.

In the example shown in FIG. 5, the core power supply terminal 131 is connected to the internal terminal group 140 via a conductive pattern 128a and a through electrode 129 that are not connected to the internal circuit among the conductive pattern formed in the interface chip 120, so that the core power supply terminal 131 is connected to the conductive pattern (internal circuit) 118 within the core chip 110. Therefore, the power supply potential VDDa supplied from the core power supply terminal 131 is supplied to only the core chip 110, without being connected to the internal circuit of the interface chip 120.

On the other hand, the interface power supply terminal 132 is connected to a conductive pattern 128b that is connected to the internal circuit and not connected to the through electrode 129 among the conductive pattern formed in the interface chip 120. Therefore, the power supply potential VDDb supplied from the interface power supply terminal 132 is supplied to only the interface chip 120, without being connected to the internal circuit of the core chip 110.

The common power supply terminal 133 is connected to the conductive pattern 128c that is connected to the internal terminal circuit and the through electrode 129 among the conductive pattern formed in the interface chip 120. Therefore, the power supply potential VDDc that is supplied from the common power supply terminal 133 is connected to the internal circuit of the core chip 110, and is also supplied to the internal circuit of the interface chip 120.

The first configuration example of the semiconductor memory device 100 according to this embodiment is as explained above. Because two chips are used in the first configuration example, the manufacturing is relatively easy. When the main surface 110a of the core chip 110 is set at the lower side as shown in FIG. 5, the through-holes are formed in only the interface chip 120. Therefore, a large memory density and high productivity of the semiconductor memory device can be achieved while restricting the increase in the manufacturing cost.

Figure 6:
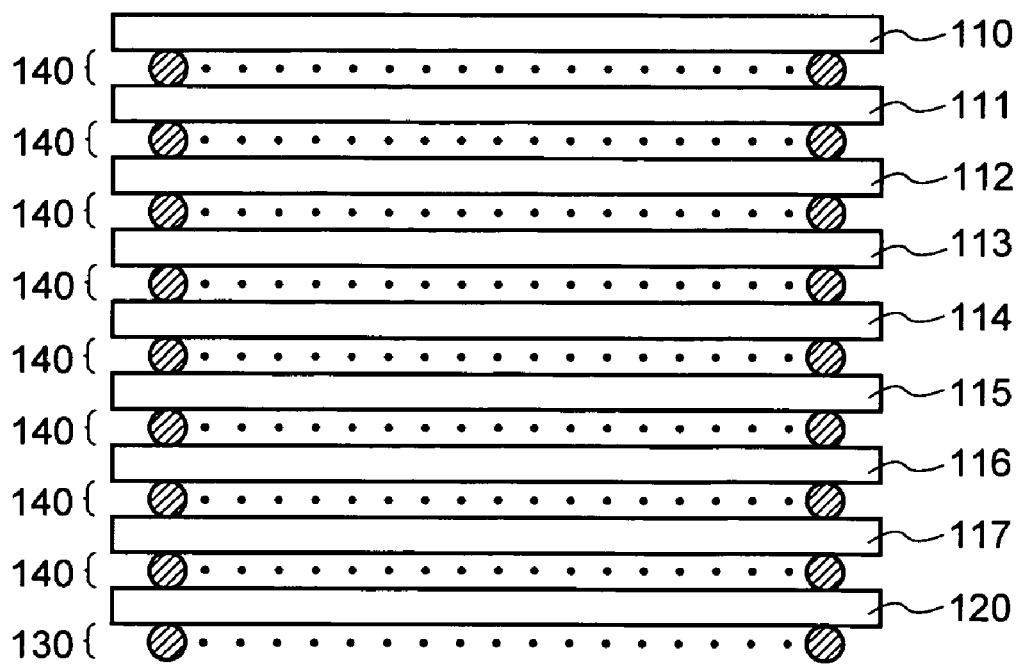
FIG. 6 shows a second configuration example of the semiconductor memory device according to a preferred embodiment of the present invention.

FIG. 6 shows a second configuration example of the semiconductor memory device 100 according to this embodiment.

As shown in FIG. 6, the second configuration example is the same as the first configuration example, except that plural (eight in FIG. 6) core chips 110 to 117 are stacked on the interface chip 120.

In this example, through-holes need to be formed in all the core chips 111 to 117 excluding at least the core chip 110 positioned on the top layer among the core chips 110 to 117. The core chips 110 to 117 need to be connected to the interface chip 120 via the through-holes 119 shown in FIG. 4B provided within the through-hole.

According to the second configuration example, because plural core chips 110 are used, memory density can be increased substantially without decreasing productivity, as compared with the first configuration example.

Figure 7:
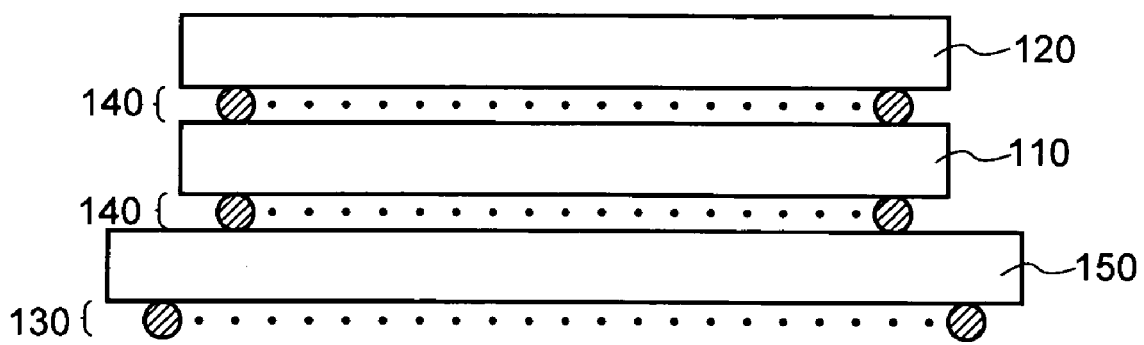
FIG. 7 shows a third configuration example of the semiconductor memory device according to a preferred embodiment of the present invention.

FIG. 7 shows a third configuration example of the semiconductor memory device 100 according to this embodiment.

As shown in FIG. 7, in the third configuration example, the interface chip 120 is stacked on the core chip 110. This stacked structure is mounted on an interposer 150. The external terminal group 130 is formed on the surface of the interposer 150.

Figure 8:
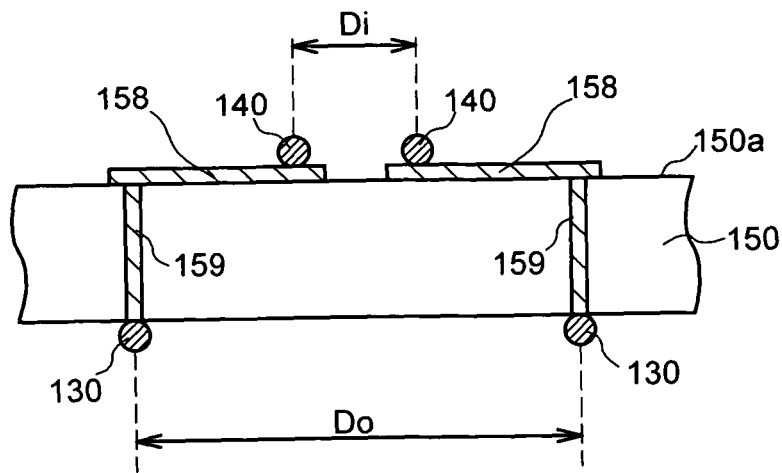
FIG. 8 is an enlarged partial cross-sectional view showing a state that a main surface of the interposer is the upper side of the interposer.

In this example, through-holes need to be formed in the interposer 150. The interface chip 120 is connected to the external terminal group 130 via through electrodes 159 provided within the through-holes as shown in FIG. 8. In this example, the through-holes also need to be formed in the core chip 110. The core chip 110 is connected to the interface chip 120 via a through electrode provided within the through-hole as described later. On the other hand, in this example, the through-holes do not need to be formed in the interface chip 120. Therefore, an additional process is not necessary in manufacturing the interface chip 120.

The interposer 150 is used for the "pitch conversion" to set the electrode pitch Do of the external terminal group larger than the electrode pitch Di of the internal terminal group 140. The pitch conversion using the interposer 150 is carried out, based on conductive patterns 158 on a main surface 150a of the interposer 150 and a through electrode 159 provided within the through-hole, as shown in FIG. 8. While FIG. 8 shows the case where the main surface 150a of the interposer 150 is set at the upper side (the core chip 110 side), the main surface 150a of the interposer 150 can be set at the lower side (at the external terminal group 130 side)

Figure 9:
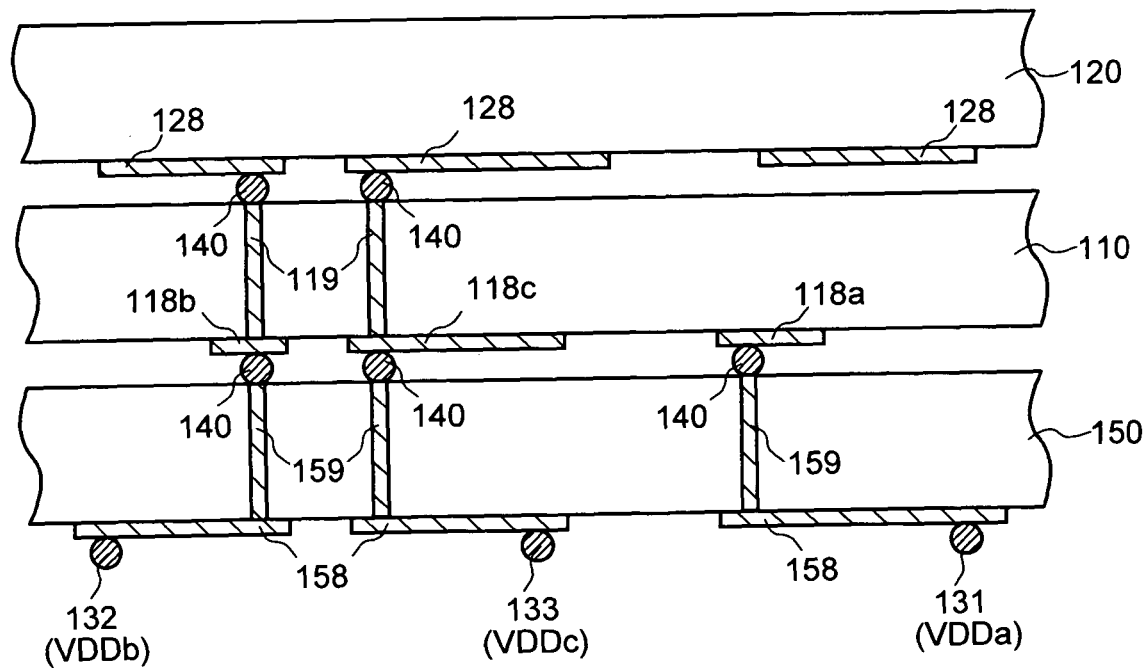
FIG. 9 is an enlarged partial cross-sectional view of the semiconductor memory device according to a third configuration example.

FIG. 9 is an enlarged partial cross-sectional view of the semiconductor memory device 100 according to the third configuration example. FIG. 9 shows a state that the core chip 110, the interface chip 120, and the interposer 150 have their main surfaces 110a, 120a, and 150a set at the lower side respectively.

In the example shown in FIG. 9, the core power supply terminal 131 is connected to a conductive pattern 118a that is connected to the internal circuit and is not connected to the through electrode 119 among the conductive patterns formed in the core chip 110. Therefore, the power supply potential VDDa supplied from the core power supply terminal 131 is supplied to only the core chip 110, without being connected to the internal circuit of the interface chip 120.

On the other hand, the interface power supply terminal 132 is connected to a conductive pattern 118b that is connected to the through electrode 119 and is not connected to the internal circuit among the conductive patterns formed in the core chip 110. Therefore, the power supply potential VDDb supplied from the interface power supply terminal 132 is supplied to only the interface chip 120, without being connected to the internal circuit of the core chip 110.

The common power supply terminal 133 is connected to a conductive pattern 118c that is connected to the internal circuit and the through electrode 119 among the conductive patterns formed in the core chip 110. Therefore, the power supply potential VDDc that is supplied from the common power supply terminal 133 is connected to the internal circuit of the core chip 110, and is also supplied to the internal circuit of the interface chip 120.

The third configuration example of the semiconductor memory device 100 according to this embodiment is as explained above. In the third configuration example, because the electrode pitch is changed using the interposer 150, a rewiring to change the electrode pitch does not need to be formed on the core chip 110. Therefore, design flexibility can be increased. Because through-holes do not need to be formed in the interface chip 120, an additional process is not necessary in manufacturing the interface chip 120.

Figure 10:
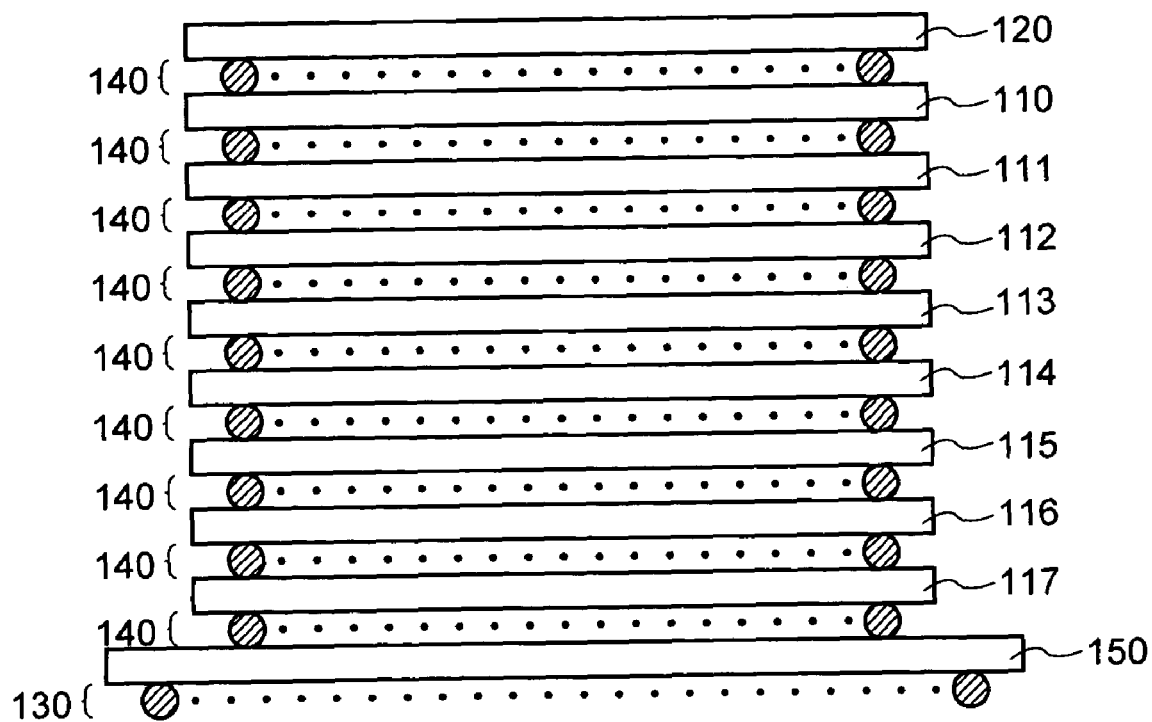
FIG. 10 shows a fourth configuration example of the semiconductor memory device according to a preferred embodiment of the present invention.

FIG. 10 is a fourth configuration example of the semiconductor memory device 100 according to this embodiment.

As shown in FIG. 10, the fourth configuration example is the same as the third configuration example, except that plural (eight in FIG. 10) core chips 110 to 117 are stacked between the interposer 150 and the interface chip 120.

In the fourth configuration example, because plural core chips 110 are used, the memory density can be substantially increased from that of the third configuration example without decreasing productivity.

The present invention is in no way limited to the aforementioned embodiments, but rather various modifications are possible within the scope of the invention as recited in the claims, and naturally these modifications are included within the scope of the invention.

Therefore, there is no particular limit to the separation of circuits between circuits that are formed on the core chip 110 and circuits that are formed on the interface chip 120. When memory cells and a circuit that holds data of the memory cells and a minimum necessary circuit that decides the quality of the core chip in the wafer test are formed on the core chip 110, and when at least a part of other circuits is formed on the interface chip 120, these circuit arrangements are sufficient.

As explained above, according to the present invention, the semiconductor memory device has the core section and the interface section structured by separate chips, and mutually different operation voltages that are optimum for both chips can be given to these chips. Therefore, in carrying out the stress test such as the burn-in test, the core chip can be tested correctly without breaking the interface chip.

What is claimed is:

1. A semiconductor memory device, comprising:
   at least one core chip having at least memory cells;
   an interface chip having at least peripheral circuits of the memory cells formed in the core chip, the core chip and the interface chip being physically separated; and
   an external terminal group including at least a core power supply terminal that is connected to an internal circuit of the core chip without being connected to an internal circuit of the interface chip, and an interface power supply terminal that is connected to an internal circuit of the interface chip without being connected to the internal circuit of the core chip,
   wherein the core chip and the interface chip are stacked, and the interface chip is disposed between the core chip and the external terminal group.

2. A semiconductor memory device, comprising:
   at least one core chip having at least memory cells;
   an interface chip having at least peripheral circuits of the memory cells formed in the core chip, the core chip and the interface chip being physically separated; and
   an external terminal group including at least a core power supply terminal that is connected to an internal circuit of the core chip without being connected to an internal circuit of the interface chip, and an interface power supply terminal that is connected to an internal circuit of the interface chip without being connected to the internal circuit of the core chip,
   wherein the core chip and the interface chip are stacked,
   the interface chip is disposed between the core chip and the external terminal group,
   a through-hole is formed in the interface chip, and
   the core power supply terminal is connected to the internal circuit of the core chip via a through electrode provided within the through-hole.

3. The semiconductor memory device as claimed in claim 2, comprising a plurality of the core chips.

4. The semiconductor memory device as claimed in claim 2, wherein the external terminal group is formed on one surface of the interface chip, and an electrode pitch of the external terminal group is set larger than an electrode pitch of the internal terminal provided on the other surface of the interface chip.

5. The semiconductor memory device as claimed in claim 2, wherein the first internal circuit of the core chip includes at least a circuit that holds data of the memory cells, and the second internal circuit of the core chip includes at least an output stage that outputs a signal to the interface chip.

6. The semiconductor memory device as claimed in claim 2, further comprising a ground terminal connected to both the internal circuit of the core chip and the internal circuit of the interface chip.

7. The semiconductor memory device as claimed in claim 2, wherein the external terminal group further includes a common power supply terminal that is connected to both the internal circuit of the core chip and the internal circuit of the interface chip.

8. A semiconductor memory device, comprising:
   at least one core chip having at least memory cells;
   an interface chip having at least peripheral circuits of the memory cells formed in the core chip, the core chip and the interface chip being physically separated; and
   an external terminal group including at least a core power supply terminal that is connected to an internal circuit of the core chip without being connected to an internal circuit of the interface chip, and an interface power supply terminal that is connected to an internal circuit of the interface chip without being connected to the internal circuit of the core chip, wherein the core chip and the interface chip are stacked, and the core chip is disposed between the interface chip and the external terminal group.

9. The semiconductor memory device as claimed in claim 8, wherein a through-hole is formed in the core chip, and the interface power supply terminal is connected to the internal circuit of the interface chip via a through electrode provided within the through-hole.

10. The semiconductor memory device as claimed in claim 8, further comprising an interposer that is disposed between the core chip and the external terminal group, and converts an electrode pitch.

11. The semiconductor memory device as claimed in claim 8, comprising a plurality of the core chips.

12. The semiconductor memory device as claimed in claim 8, wherein the first internal circuit of the core chip includes at least a circuit that holds data of the memory cells, and the second internal circuit of the core chip includes at least an output stage that outputs a signal to the interface chip.

13. The semiconductor memory device as claimed in claim 8, further comprising a ground terminal connected to both the internal circuit of the core chip and the internal circuit of the interface chip.

14. The semiconductor memory device as claimed in claim 8, wherein the external terminal group further includes a common power supply terminal that is connected to both the internal circuit of the core chip and the internal circuit of the interface chip.

15. The semiconductor memory device as claimed in claim 14, wherein the core power supply terminal is connected to a first internal circuit of the core chip, the common power supply terminal is connected to a second internal circuit of the core chip, the first internal circuit of the core chip includes at least a circuit part that holds data of the memory cells, and the second internal circuit of the core chip includes at least an output stage that outputs a signal to the interface chip.

16. The semiconductor memory device as claimed in claim 7, wherein the core power supply terminal is connected to a first internal circuit of the core chip, the common power supply terminal is connected to a second internal circuit of the core chip, the first internal circuit of the core chip includes at least a circuit part that holds data of the memory cells, and the second internal circuit of the core chip includes at least an output stage that outputs a signal to the interface chip.

17. A semiconductor memory device, comprising:
at least one core chip having at least memory cells;
an interface chip having at least peripheral circuits of the memory cells formed in the core chip, the core chip and the interface chip being physically separated; and
an external terminal group including at least a core power supply terminal that is connected to an internal circuit of the core chip without being connected to an internal circuit of the interface chip, and an interface power supply terminal that is connected to an internal circuit of the interface chip without being connected to the internal circuit of the core chip, wherein the core chip and the interface chip are stacked,
the interface chip is disposed between the core chip and the external terminal group
the external terminal group is formed on one surface of the interface chip, and
an electrode pitch of the external terminal group is set larger than an electrode pitch of the internal terminal provided on the other surface of the interface chip.

18. The semiconductor memory device as claimed in claim 17, wherein the first internal circuit of the core chip includes at least a circuit that holds data of the memory cells, and the second internal circuit of the core chip includes at least an output stage that outputs a signal to the interface chip.

19. The semiconductor memory device as claimed in claim 17, further comprising a ground terminal connected to both the internal circuit of the core chip and the internal circuit of the interface chip.

20. The semiconductor memory device as claimed in claim 17, wherein the external terminal group further includes a common power supply terminal that is connected to both the internal circuit of the core chip and the internal circuit of the interface chip.

21. The semiconductor memory device as claimed in claim 20, wherein the core power supply terminal is connected to a first internal circuit of the core chip, the common power supply terminal is connected to a second internal circuit of the core chip, the first internal circuit of the core chip includes at least a circuit part that holds data of the memory cells, and the second internal circuit of the core chip includes at least an output stage that outputs a signal to the interface chip.

22. A semiconductor memory device, comprising:
at least one core chip having at least memory cells;
an interface chip having at least peripheral circuits of the memory cells formed in the core chip, the core chip and the interface chip being physically separated; and
an external terminal group including at least a core power supply terminal that is connected to an internal circuit of the core chip without being connected to an internal circuit of the interface chip; and an interface power supply terminal that is connected to an internal circuit of the interface chip without being connected to the internal circuit of the core chip;

wherein the semiconductor memory device is subject to a burn-in test in which the core chip and the interface chip are tested simultaneously while the core power supply terminal is being supplied with a first voltage and the interface power supply terminal is being supplied with a second voltage smaller than the first voltage, wherein the semiconductor memory device performs a normal operation while the core power supply terminal and the interface power supply terminal are being supplied in common with a third voltage smaller than the second voltage.

* * * * *